(12) United States Patent
Rao

(10) Patent No.: US 7,885,110 B2
(45) Date of Patent: Feb. 8, 2011

(54) RANDOM ACCESS MEMORY WITH CMOS-COMPATIBLE NONVOLATILE STORAGE ELEMENT AND PARALLEL STORAGE CAPACITOR

(76) Inventor: G. R. Mohan Rao, 1404 Westmont Dr., McKinney, TX (US) 75070

( * ) Notice: Subject to any disclaimer, the term of this patent is extended or adjusted under 35 U.S.C. 154(b) by 295 days.

(21) Appl. No.: 12/054,973

(22) Filed: Mar. 25, 2008

(65) Prior Publication Data
US 2009/0244970 A1 Oct. 1, 2009

(51) Int. Cl.
*G11C 14/00* (2006.01)
(52) U.S. Cl. .................. 365/185.08; 365/149; 365/158; 365/163
(58) Field of Classification Search ............ 365/185.08, 365/149, 158, 163, 171, 173
See application file for complete search history.

(56) References Cited

U.S. PATENT DOCUMENTS

| | | | |
|---|---|---|---|
| 4,233,672 A | 11/1980 | Suzuki et al. | |
| 4,449,205 A | 5/1984 | Hoffman | |
| 5,043,946 A | 8/1991 | Yamauchi et al. | |
| 5,757,696 A | 5/1998 | Matsuo et al. | |
| 5,835,932 A | 11/1998 | Rao | |
| 5,890,195 A | 3/1999 | Rao | |
| 5,995,409 A | 11/1999 | Holland | |
| 6,222,216 B1 | 4/2001 | Rao et al. | |
| 6,282,118 B1 * | 8/2001 | Lung et al. ............. | 365/185.08 |
| 6,654,284 B2 * | 11/2003 | Hsu et al. ............. | 365/185.18 |
| 6,963,122 B1 | 11/2005 | Soenen et al. | |
| 6,992,928 B2 * | 1/2006 | Inoue ................... | 365/185.08 |
| 2005/0041470 A1 | 2/2005 | Inoue | |
| 2006/0120138 A1 | 6/2006 | Liaw et al. | |

(Continued)

FOREIGN PATENT DOCUMENTS

EP     1437742     7/2004

(Continued)

OTHER PUBLICATIONS

International Search Report and Written Opinion, issued in International Patent Application No. PCT/US2009/038290, mailed Dec. 21, 2009, 12 pages.

(Continued)

*Primary Examiner*—Vu A Le
*Assistant Examiner*—Han Yang
(74) *Attorney, Agent, or Firm*—Schwabe, Williamson & Wyatt, P.C.

(57) ABSTRACT

Systems, methods, and memory device with row lines and column lines arranged in a matrix configuration with a memory cell coupled to one of the column lines and one of the row lines. The memory cell includes a storage capacitor with a first plate coupled to a storage node, a CMOS-compatible non-volatile storage element having a node coupled to the storage node and configured to hold a charge corresponding to a binary value, and an access transistor coupled to the storage node. The access transistor includes a word line gate, a first node, and a second node, the word line gate being coupled to the one of the plurality of row lines, the first node being coupled to the one of the plurality of column lines, the second node being coupled to the storage node and to said node of the CMOS-compatible non-volatile storage element.

12 Claims, 4 Drawing Sheets

U.S. PATENT DOCUMENTS

| | | |
|---|---|---|
| 2007/0016720 A1 | 1/2007 | Cohen |
| 2007/0076510 A1 | 4/2007 | Mangan et al. |
| 2007/0296486 A1 | 12/2007 | Ambroggi et al. |
| 2009/0225584 A1 | 9/2009 | Rao |
| 2009/0237997 A1 | 9/2009 | Rao |

FOREIGN PATENT DOCUMENTS

| | | |
|---|---|---|
| WO | 2009111270 | 9/2009 |
| WO | 2009120691 | 10/2009 |
| WO | 2009154833 | 12/2009 |

OTHER PUBLICATIONS

Hayashikoshi, M. et al., "A Dual-Mode Sensing Scheme of Capacitor-Coupled EEPROM Cell," IEEE Journal of Solid-State Circuits, Apr. 1992, pp. 569-573.

International Search Report and Written Opinion, issued in International Patent Application No. PCT/US2009/038096, mailed Jul. 2, 2009, 15 pages.

International Search Report and Written Opinion, issued in International Patent Application No. PCT/US2009/035329, mailed Apr. 22, 2009, 11 pages.

Office Action, issued in U.S. Appl. No. 12/053,976, mailed Nov. 12, 2009.

Office Action, issued in U.S. Appl. No. 12/043,044, mailed Oct.27, 2009.

Office Action, issued in U.S. Appl. No. 12/043,044, mailed Aug. 30, 2010, 19 pages.

Office Action, issued in U.S. Appl. No. 12/053,976, mailed Sep. 1, 2010, 8 pages.

Office Action, issued in U.S. Appl. No. 12/043,044, mailed Mar. 24, 2010.

Office Action, issued in U.S. Appl. No. 12/053,976, mailed May 27, 2010.

International Preliminary Report on Patentability, issued in International Patent Application No. PCT/US2009/035329, mailed Sep. 16, 2010, 9 pages.

International Preliminary Report on Patentability, issued in International Patent Application No. PCT/US2009/038096, mailed Oct. 7, 2010, 11 pages.

International Preliminary Report on Patentability, issued in International Patent Application No. PCT/US2009/038290, mailed Oct. 7, 2010, 8 pages.

* cited by examiner

RANDOM ACCESS MEMORY WITH CMOS-COMPATIBLE NONVOLATILE STORAGE ELEMENT AND PARALLEL STORAGE CAPACITOR

TECHNICAL FIELD

Embodiments of the disclosure relate to the field of electronic circuits. In particular to digital memories having CMOS-Compatible Nonvolatile Storage Elements with parallel storage capacitors and random access memory characteristics.

BACKGROUND

Standard DRAM utilizes a capacitor to store a charge. Advantages include fast read and true random access, but the device is volatile and requires refresh to maintain the stored charge. U.S. Pat. Nos. 5,995,409 and 6,222,216 describe DRAM with contiguous memory space dedicated to nonvolatile storage. This is accomplished by "shorting" capacitors to either "1" or "0" to provide nonvolatile—but not reprogrammable—digital memory.

Flash memory provides one type of reprogrammable non-volatile memory. Flash memory read times are relatively slow due to limitations of the floating-gate transistor—or split-channel floating-gate transistor—that forms the basis for the flash memory cell. In standard flash, in order to properly engineer the floating-gate transistor for write and erase, the transistor regions are heavily doped. This creates a high threshold voltage (approximately 1V) relative to the power supply voltage in current art (approximately 1.8V), across the drain and source. This relatively high threshold voltage is needed to avoid "unintended disturbances" in unselected nonvolatile memory cells. When 1.5V (approximately) is applied to the control gate to select the transistor, the amount of current from source to drain is accordingly relatively low, and it therefore takes a relatively long time for the circuit to drive the bit line connected to the floating-gate transistor. Thus, the time required to sense the current—which corresponds to the stored charge—is longer than sensing times in standard DRAM, for example. This challenge is further complicated and worsened for device and circuit optimization as nonvolatile memory systems demand multilevel storage (instead of 1-bit binary only).

Split-channel flash (developed in the 1980s) utilizes a split-channel floating-gate transistor to provide reprogrammable non-volatile memory, but these have numerous limitations such as requiring source-side programming and the slower read times of Flash memory. It must also be activated and read simultaneously.

BRIEF DESCRIPTION OF THE DRAWINGS

Embodiments will be readily understood by the following detailed description in conjunction with the accompanying drawings. Embodiments of the disclosure are illustrated by way of example and not by way of limitation in the figures of the accompanying drawings.

DETAILED DESCRIPTION OF EMBODIMENTS

Figure 1:
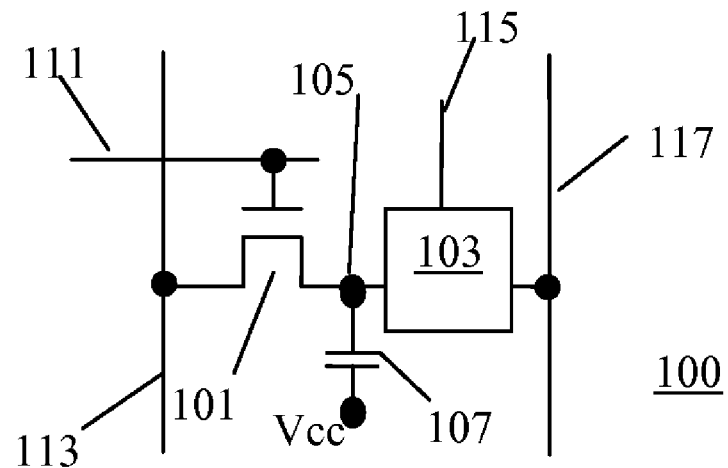
FIG. 1 illustrates a Random Access Memory cell with CMOS-Compatible Nonvolatile Storage Element and parallel storage capacitor in accordance with various embodiments.

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

Embodiments may include memory devices and systems with memory cells comprising an access transistor in series with a CMOS-compatible non-volatile storage element and parallel storage capacitor. The CMOS-compatible non-volatile storage element may be Magnetoresistive Random Access Memory (MRAM) cell, Phase-change memory (PCM) cell, or floating-gate transistor (e.g. a Flash memory cell) in various embodiments. The storage capacitor, CMOS-compatible non-volatile storage element, and a node of the access transistor may all be coupled to a common storage node within the memory cell. Embodiments may provide fast read on par with dynamic random access memory (DRAM)

along with the non-volatility of Flash. In embodiments, stored charges may be erased one bit at a time, unlike in typical Flash. Also, unlike split-channel flash memory which requires source-side erase leading to potential disturbances of neighboring cells, embodiments may utilize "drain side" erasing. Finally, during a read operation, the CMOS-compatible non-volatile storage element may be activated and the resulting voltage may be held by the storage capacitor for a period of time, typically several milliseconds. At some later time, the access transistor may be activated to sense the held voltage. This decoupling of the activation and access operations, which may be made possible by the parallel storage capacitor, may allow greater flexibility in the operation of the memory circuit.

In standard flash memory, in order to properly engineer the floating-gate transistor for write and erase, the transistor regions are heavily doped. This creates a high threshold voltage (approximately 1V) across the drain and source. When 1.5V is applied to the control gate of the floating-gate transistor to select the transistor (e.g. a typical word line voltage), the amount of current from source to drain is relatively low, and it takes a relatively long time to drive the bit line; thus, read times are slow. Also, because the floating-gate transistor is engineered for write operations, read times are slow not only relative to the read times in other types of memory, but also slower than the write times on the same flash memory device.

Embodiments may include access circuitry coupled to a plurality of memory cells. The access circuitry may be configured to activate the CMOS-compatible non-volatile storage element at a first time in order to generate a voltage on the common storage node. The generated voltage may correspond to a binary value stored within the CMOS-compatible non-volatile storage element. A first plate of the storage capacitor connected to the common storage node may be configured to substantially hold the voltage for a period of time, up to several milliseconds. For example, a typical DRAM capacitor practiced in the art today may be configured to hold a voltage for approximately 16 ms. The access circuitry may then be configured to activate the access transistor at a second time later than the first time, and sense the held voltage on a column line attached to the access transistor. The difference between the first and second times may be less than or equal to the period of time that the storage capacitor is configured to substantially hold the voltage. In embodiments, this may allow the access circuitry to decouple the activating of the CMOS-compatible non-volatile storage element from the activating of the access transistor. Therefore—unlike the memory cell and device described in U.S. patent application Ser. No. 12/053,976—the word line may not need to be simultaneously activated along with the CMOS-compatible non-volatile storage element and the stored voltage may be sensed at a later time. The access circuitry may therefore be configured to perform simultaneous operations on parallel memory cells (those connected to the same word line), thereby providing additional flexibility in the timing and accessing of memory cells within the memory device.

U.S. patent application Ser. No. 12/053,976 describes a digital memory cell with an access transistor in series with a CMOS-compatible non-volatile storage element, most notably a floating-gate transistor. That application describes a reprogrammable, non-volatile memory device with true random access characteristics. Sensing of the stored value has to occur at the same time as the floating-gate transistor is activated. Meanwhile, all other memory cells in parallel to the cells being accessed (i.e. those on the same word line) have to be held "quiet" during this read operation.

In embodiments disclosed herein, the same engineering principles from standard Flash may apply to the floating-gate transistor, but read times may be faster. Adding the access transistor and the parallel storage capacitor may allow voltages to be sensed, similar to standard DRAM, as opposed to the currents that must be sensed in Flash memory. Thus, read times may be faster than Flash and may be more on par with standard DRAM while providing a reprogrammable and non-volatile memory device.

FIG. 1 illustrates a memory cell 100 with CMOS-Compatible Nonvolatile Storage Element 103 and parallel storage capacitor in accordance with various embodiments. Access transistor 101 may be arranged in series with CMOS-Compatible Nonvolatile Storage Element 103 with storage node 105 between them. A first plate of storage capacitor 107 may be coupled to storage node 105. A second plate of storage capacitor 107 may be held at a constant voltage, such as for example a power supply voltage. CMOS-compatible non-volatile storage element 103 may be configured to hold a charge corresponding to a stored binary value. In embodiments, the stored binary value may be an n-bit binary value, such as for example a 2-bit binary value. Access transistor 101 may have a word line gate connected to row line 111 and a first node connected to column line 113. In embodiments, storage node 105 may be connected to a second node of access transistor 101. CMOS-Compatible Nonvolatile Storage Element 103 may be connected to control line 115 and drain line 117. In embodiments, an array of memory cells 100 may be arranged in a plurality of rows and columns connected by plurality of row lines 111 and column lines 113. Access circuitry may be coupled to the row lines 111, column lines 113, control lines 115, and drain lines 117 to perform access operations on the various memory cells 100 such as, for example, read, write, and erase operations. Such access circuitry may be configured to receive memory addresses and access commands and perform access operations on those memory cells 100 identified by the received addresses.

In embodiments, CMOS-compatible non-volatile storage element 103 may be a Magnetoresistive Random Access Memory (MRAM) cell, Phase-change memory (PCM) cell, or floating-gate transistor (e.g. a flash memory cell).

Figure 2:
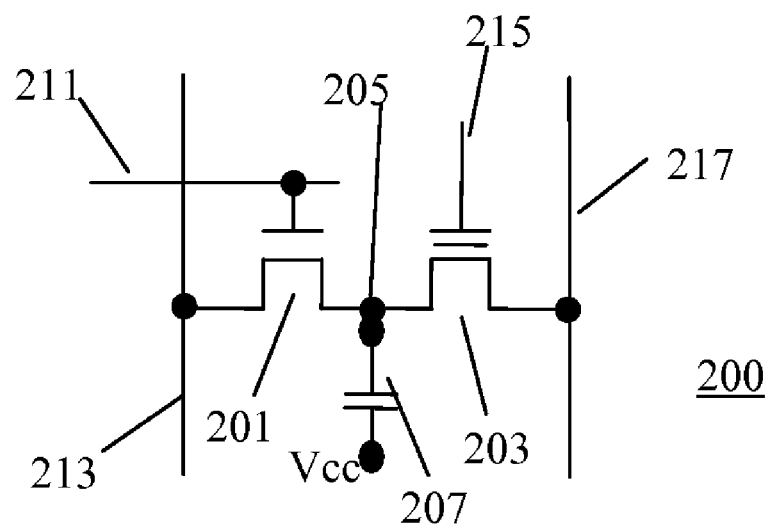
FIG. 2 illustrates a Random Access Memory cell with a floating-gate transistor storage element and parallel storage capacitor in accordance with various embodiments.

FIG. 2 illustrates Random Access Memory cell 200 with floating-gate transistor 203 and parallel storage capacitor 207 in accordance with various embodiments. Access transistor 201 may be arranged in series with floating-gate transistor 203 with storage node 205 between them. A first plate of storage capacitor 207 may be coupled to storage node 205 and a second plate may be held at a constant potential, such as for example a supply voltage. A floating-gate of floating-gate transistor 203 may be configured to hold a charge corresponding to a stored binary value. In embodiments, the stored binary value may be an n-bit binary value, such as for example a one or two-bit binary value. Access transistor 201 may have a word line gate connected to row line 211 and a first node connected to column line 213. In embodiments, storage node 205 may be connected to a source node of floating-gate transistor 203. In embodiments, floating-gate transistor 203 may have a control gate connected to control line 215 and a drain node connected to drain line 217.

In embodiments, during a read operation, access circuitry (not shown) may be configured to set a select voltage on select line 215 and drain line 217 at a first time. In embodiments, the select voltage may be the same as a supply voltage such as for example, 3.3V, 1.5V, 1.8V, 1.0V, or other voltage. Embodiments are not limited to any particular supply or select voltages. In n-channel floating gate nonvolatile memory transistors, negative charges (electrons) may be stored on the floating gate of a floating-gate transistor to program the transistor. If a negative charge has been previously stored on the floating-gate of floating-gate transistor 203, then the select voltage on select line 215—and therefore on the select gate—may be "masked" (neutralized or compensated) by the stored negative charge on the floating-gate transistor. In that case, the floating-gate transistor may not be activated and no voltage may be applied on storage node 205. By contrast, if no negative charge has been previously stored on the floating-gate—or if such a stored negative charge has been subsequently erased—then there will be no masking of the select voltage and a voltage may be applied on storage node 205. The first plate of storage capacitor 207 may be configured to hold the applied charge on storage node 205 for a period of time, up to several milliseconds. For example, a typical DRAM capacitor practiced in the art today may be configured to hold a voltage for 16 ms, or other time period.

In embodiments, a stored negative charge on the floating-gate may indicate a binary "0" and the access circuitry may be configured to associate a low sensed voltage to a binary "0". In other words, the access circuitry may be configured to associate a sensed voltage falling within a relatively low range of voltage to a binary "0". The access circuitry may also be configured to associate a larger sensed voltage to a binary "1". In other words, the access circuitry may be configured to associate a sensed voltage falling within a relatively high range of voltage to a binary "1". In embodiments where the stored charge on the floating-gate transistor corresponds with an n-bit binary number, where n is greater than 1, the access circuitry may be configured to sense any of $2^n$ voltage ranges and associate each with a different n-bit binary stored value. In such embodiments, the level of sensed voltage may be determined by a magnitude of the stored charge within the floating-gate transistor.

In embodiments, the floating-gate transistor may be configured to be written or programmed by either Fowler-Nordheim tunneling or hot electron injection, both of which are well-known in the art. Embodiments are not limited by any writing or programming techniques. The access circuitry (not shown) may be configured in embodiments to perform a write or program operation. In embodiments, the access circuitry may be configured to set column line 213 to 0V, row line 211 to a select voltage, and control line 215 and drain line 217 to a program voltage to write to the floating-gate. In embodiments, the program voltage may be greater than a supply voltage and the select voltage may be equal to, or nearly equal to, the supply voltage. In embodiments, the program voltage may be between 6V to 8V, or other voltage.

During an erase operation, the access circuitry (not shown) may be configured, in embodiments, to set column line 213 to ground, row line 211 to a select voltage, and drain line 217 to an erase voltage. In embodiments, the erase voltage may be greater than a supply voltage, and the select voltage may be equal to the supply voltage. This may result in a "drain-side" erase. Alternatively, the access circuitry may be configured to perform a "source-side" erase.

The above embodiments may apply to n-channel floating-gate transistors; hence the positive voltages. The same concepts may apply equally to p-channel floating-gate transistors utilizing negative voltages. Also, in embodiments, a stored charge on the floating-gate of the floating-gate transistor may correspond to a binary "0", but may correspond to a binary "1" in other embodiments. Embodiments are not limited to n-channel or p-channel transistors.

Figure 3:
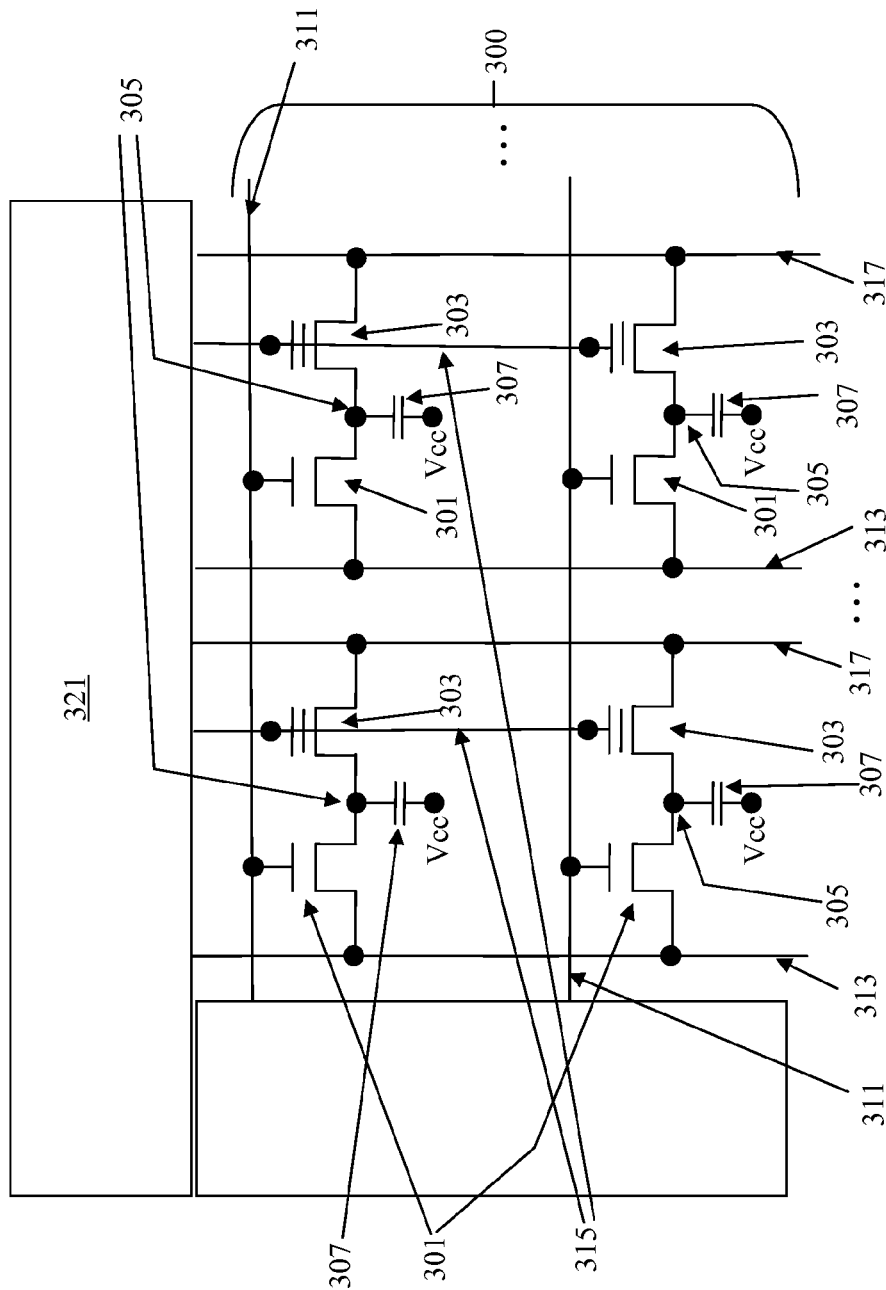
FIG. 3 illustrates Random Access Memory cell array with access circuitry and memory cells having CMOS-Compatible Nonvolatile Storage Elements and parallel storage capacitors in accordance with various embodiments.

FIG. 3 illustrates Random Access Memory cell array 300 with access circuitry 321 and CMOS-Compatible Nonvolatile Storage Elements 303 with parallel storage capacitors 307 in accordance with various embodiments. Array 300 may include a plurality of row lines 311 and a plurality of column lines 313 arranged in a matrix configuration. Although array 300 is shown with only two column lines and two row lines—including four memory cells—many more row lines, column, lines, and memory cells in various configurations may be possible in various embodiments. Embodiments are not limited to any particular array size or sizes.

Access circuitry 321 may be coupled to the plurality of row lines 311, the plurality of column lines 313, the plurality of control lines 315, and the plurality of drain lines 317. In embodiments, access circuitry 321 may be configured to set one or more of the plurality of row lines 311 to a select voltage to select a particular row or rows of memory cells to be read, written, or erased. In a read operation, in embodiments, access circuitry 321 may be configured to set one or more control lines 315 to the select voltage and one or more drain lines 317 to a read voltage at a first time and a control line 315 connected to the control gate of access transistors 301 at a second time later than the first time and sense the voltage held by storage capacitor 307 on one of column lines 313. In embodiments, access circuitry 321 may be configured to ensure that a difference between the first time and the second time is less than or equal to the period of time that storage capacitors 307 are configured to substantially hold the voltage, so that the voltage can be properly sensed by the access circuitry without errors. In embodiments, access circuitry 321 may be configured to select one or more memory cells for erasing and/or programming, as described in more detail above in relation to FIG. 2. In embodiments, access circuitry 321 may be configured to select a single word or memory cell for erase.

In embodiments, the binary value corresponding to a stored charge may comprise n-bits and the voltage sensed during a read operation may comprise $2^n$ possible voltage ranges. In such embodiments, access circuitry 321 may be configured to sense the voltage and determine which of $2^n$ voltage ranges the sensed voltage matches at a point in time. In embodiments, access circuitry 321 may be configured to perform simultaneous operations on other memory cells connected to the same row line 311 as the memory cell with the activated floating-gate transistor prior to activating access transistor 301. Such operations may include read, write, or erase operations in embodiments.

Figure 4:
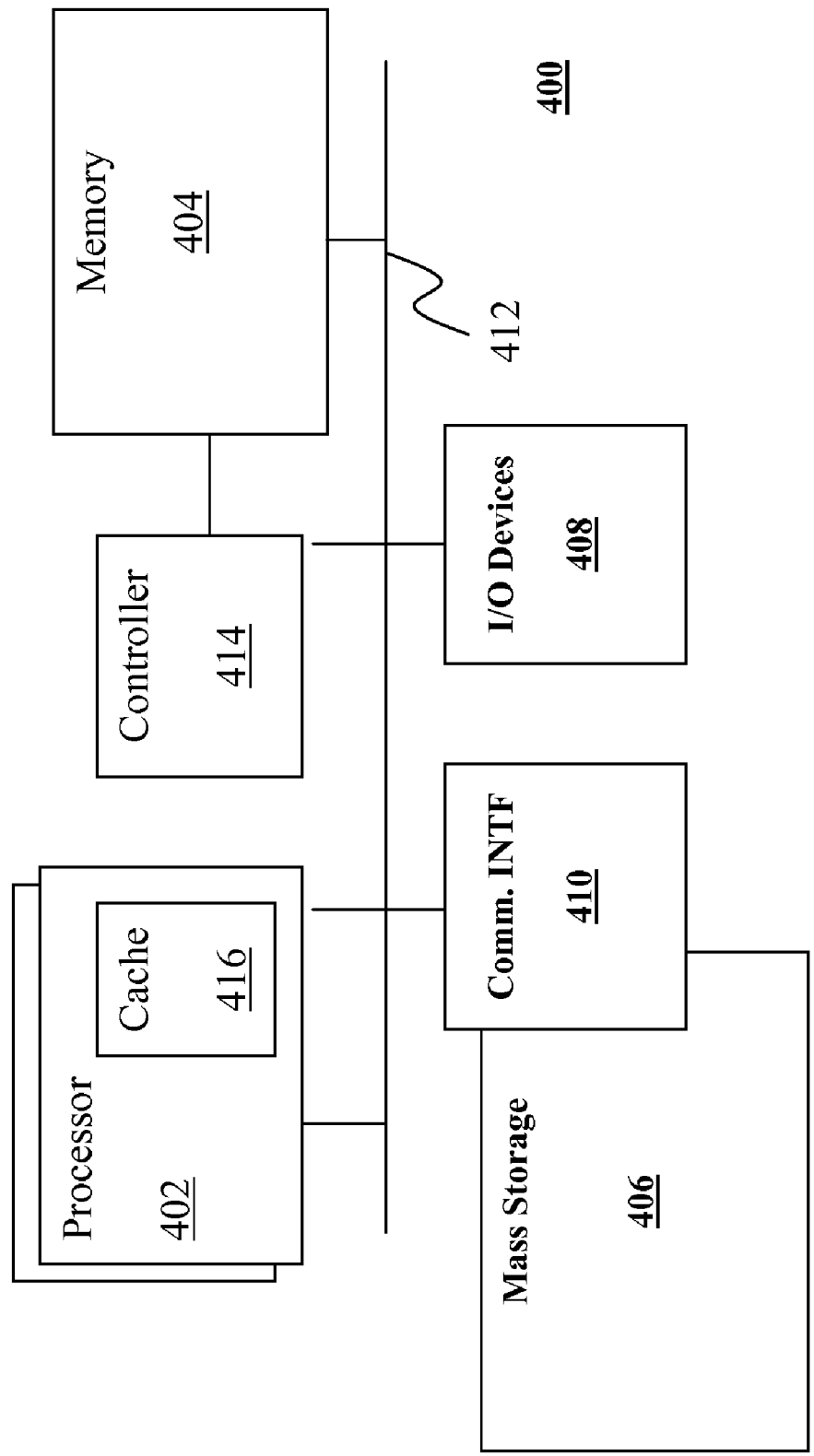
FIG. 4 illustrates a computing system including a memory device with memory cells having CMOS-Compatible Nonvolatile Storage Elements and parallel storage capacitors in accordance with various embodiments.

FIG. 4 illustrates a computing system including a memory device with CMOS-Compatible Nonvolatile Storage Elements in accordance with various embodiments. As shown, computing system/device 400 may include one or more processors 402, and system memory 404. System memory 404 may be imbued with the teachings of one or more embodiments as described within this specification. In particular, system memory 404 may include one or more memory cells including CMOS-Compatible Nonvolatile Storage Elements with parallel storage capacitors. In embodiments, such CMOS-Compatible Nonvolatile Storage Elements may be a floating-gate transistor. In embodiments, it may be a Magnetoresistive Random Access Memory (MRAM) cell or a Phase-change memory (PCM) cell. System memory 404 may also include access circuitry configured to operate in one or more ways compatible with embodiments described elsewhere within this specification.

Additionally, computing system/device 400 may include mass storage devices 406 (such as diskette, hard drive, CDROM, flash memory, and so forth), input/output devices 408 (such as keyboard, cursor control and so forth) and communication interfaces 410 (such as network interface cards, modems and so forth). The elements may be coupled to each other via system bus 412, which represents one or more buses. In the case of multiple buses, they may be bridged by one or more bus bridges (not shown). Finally, controller 414 may be included and configured to operate memory 404 in accordance with embodiments.

In embodiments, one or more processors 402 may include memory cache 416. Other than the teachings of the various embodiments of the present invention, each of the elements of computer system/device 400 may perform its conventional functions known in the art. In particular, system memory 404 and mass storage 406 may be employed to store a working copy and a permanent copy of programming instructions implementing one or more software applications.

Although FIG. 4 depicts a computer system, one of ordinary skill in the art will recognize that embodiments of the disclosure may be practiced using other devices that utilize RAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

In various embodiments, the earlier-described memory cells are embodied in an integrated-circuit. Such an integrated-circuit may be described using any one of a number of hardware-design-languages, such as but not limited to VHSIC hardware-description-language (VHDL) or Verilog. The compiled design may be stored in any one of a number of data format, such as but not limited to GDS or GDS II. The source and/or compiled design may be stored on any one of a number of medium such as but not limited to DVD.

Figure 5:
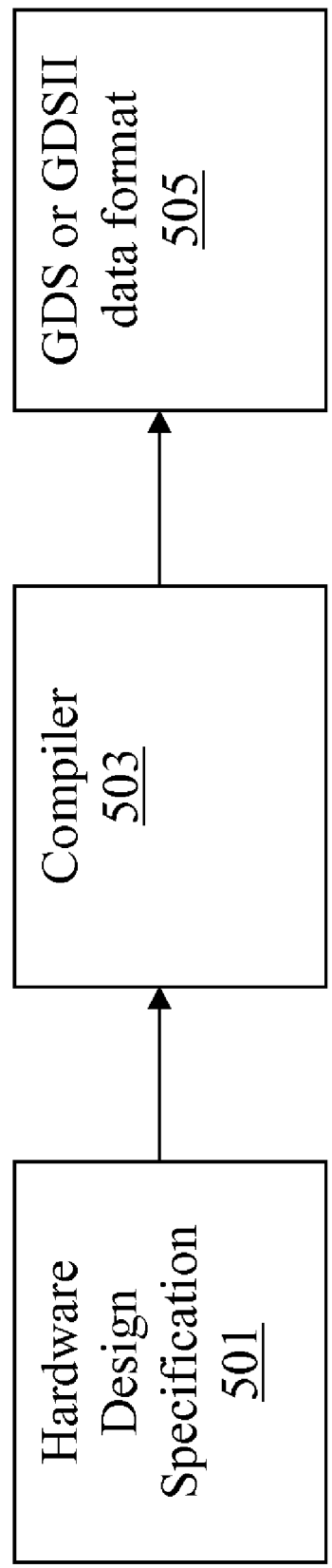
FIG. 5 shows a block diagram of a hardware design specification being compiled into GDS or GDSII data format in accordance with various embodiments.

FIG. 5 shows a block diagram depicting the compilation of a hardware design specification 501 which may be run through compiler 503 producing GDS or DGSII data format 505 describing an integrated circuit in accordance with various embodiments.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the disclosure may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A memory device, comprising:
   a plurality of row lines and a plurality of column lines;
   a memory cell coupled to one of the plurality of column lines and to one of the plurality of row lines, wherein the memory cell includes a storage capacitor coupled to a storage node, a CMOS-compatible non-volatile storage element coupled to the storage node, and an access transistor coupled to the storage node; and
   access circuitry coupled to the CMOS-compatible non-volatile storage element, to the plurality of row lines, and to the plurality of column lines, wherein the access circuitry is configured to perform a read operation, and wherein the read operation comprises:
   an activation of the CMOS-compatible non-volatile storage element at a first time, wherein the CMOS-compatible non-volatile storage element is configured, in response to the activation, to apply a voltage to the storage node corresponding to a stored binary value; and
   a setting of the one of the plurality of row lines to a select voltage at a second time, later than the first time, wherein the storage capacitor is configured to substantially hold the voltage applied to the storage node for a period of time, and wherein an elapsed time between the first time and the second time is equal to or less than the period of time.

2. The memory device of claim 1, wherein:
   the CMOS-compatible non-volatile storage element is further configured to hold a charge corresponding to the stored binary value;
   the access transistor comprises a word line gate, a first node, and a second node;
   the word line gate is coupled to the one of the plurality of row lines;
   the first node is coupled to the one of the plurality of column lines; and
   the second node is coupled to the storage node.

3. The memory device of claim 1, wherein the binary value comprises n bits, and wherein the read operation comprises a sensing of the applied voltage and a determination of which of $2^n$ voltage ranges the applied voltage matches.

4. The memory device of claim 1, wherein the CMOS-compatible non-volatile storage element comprises a floating-gate transistor including a source node coupled to the storage node.

5. The memory device of claim 4, wherein the memory device further comprises a drain line, and wherein the floating-gate transistor further comprises a drain node coupled to the drain line.

6. The memory device of claim 5, wherein the floating-gate transistor further comprises a control gate, wherein the access circuitry is further coupled to the control gate and to the drain line, and wherein the activation of the CMOS-compatible non-volatile storage element includes a driving of the control gate to the select voltage.

7. The memory device of claim 1, wherein the CMOS-compatible non-volatile storage element is one of a Magnetoresistive Random Access Memory (MRAM) cell or a Phase-Change Memory (PCM) cell.

8. The memory device of claim 1, wherein the CMOS-compatible non-volatile storage element comprises a floating-gate transistor.

9. The memory device of claim 1, wherein the access circuitry is further configured to vary the elapsed time.

10. The memory device of claim 1, further comprising another memory cell coupled to the one of the plurality of row lines, and wherein the access circuitry is further configured to perform another read operation on the other memory cell substantially simultaneously with the read operation being performed on the memory cell.

11. The memory device of claim 5, wherein the floating-gate transistor comprises a control gate, wherein the access circuitry is further coupled to the control gate and to the drain line, wherein the access circuit is further configured to perform a write operation, wherein the write operation comprises a setting of the one of the plurality of column lines to ground, a setting of the one of the plurality of row lines to the select voltage, a setting of the control gate to a program voltage, and a setting of the drain line to the program voltage, and wherein the program voltage is greater than a supply voltage of the memory device.

12. The memory device of claim 5, wherein the access circuit is further configured to perform an erase operation, wherein the erase operation comprises a setting of the one of the plurality of column lines to ground, a setting of the one of the plurality of row lines to the select voltage, and a setting of the drain line to an erase voltage, and wherein the erase voltage is greater than a supply voltage of the memory device.

* * * * *

UNITED STATES PATENT AND TRADEMARK OFFICE
CERTIFICATE OF CORRECTION

PATENT NO. : 7,885,110 B2  
APPLICATION NO. : 12/054973  
DATED : February 8, 2011  
INVENTOR(S) : Rao Page 1 of 1

It is certified that error appears in the above-identified patent and that said Letters Patent is hereby corrected as shown below:

Title page, item (54), under "Title", in Column 1, Line 2, delete "NONVOLATILE" and insert -- NON-VOLATILE --.

Column 1, line 2 (in the Title), delete "NONVOLATILE" and insert -- NON-VOLATILE --.

Signed and Sealed this  
Seventh Day of June, 2011

David J. Kappos  
*Director of the United States Patent and Trademark Office*